United States Patent [19]

Katsumura et al.

[11] 3,911,431

[45] Oct. 7, 1975

[54] LIGHT-EMITTING DISPLAY DEVICE

[75] Inventors: Hiroshi Katsumura, Tokyo; Kei Kaneda, Kawasaki; Osamu Abe, Yokohama, all of Japan

[73] Assignee: Tokyo Shibaura Electric Co., Ltd., Kawasaki, Japan

[22] Filed: Jan. 21, 1974

[21] Appl. No.: 435,213

[30] Foreign Application Priority Data

Jan. 22, 1973 Japan .................................. 48-8546
Jan. 31, 1973 Japan .................................. 48-11843
Jan. 31, 1973 Japan .................................. 48-12801

[52] U.S. Cl. ......... 340/378 A; 313/510; 340/166 EL
[51] Int. Cl.$^2$ ......................... H01J 1/62; H01J 63/04
[58] Field of Search ...... 340/378 R, 378 B, 166 EL, 340/338, 380; 313/498, 499, 500, 501, 503, 113, 114, 510, 512; 317/234, 235, 499

[56] References Cited

UNITED STATES PATENTS 3,388,277 6/1968 Thornton ........................ 313/503 X
3,501,676 3/1970 Adler et al. ........................ 315/169
3,573,568 4/1971 Siegel ........................ 313/501 X
3,609,475 9/1971 Kaposhilin ........................ 317/234 R
3,611,069 10/1971 Galginaitis ........................ 317/235 R
3,673,450 6/1972 Leach ........................ 313/510 X
3,673,572 6/1972 Sliva ........................ 340/166 EL
3,703,656 11/1972 Barnett et al. ........................ 313/108 D

*Primary Examiner*—John W. Caldwell
*Assistant Examiner*—William M. Wannisky
*Attorney, Agent, or Firm*—Oblon, Fisher, Spivak, McClelland & Maier

[57] ABSTRACT

A light-emitting display device comprising a plurality of light-emitting semiconductor elements so arranged as to represent a desired pattern on a base plate bearing printed conductive layers, wherein the light-emitting semiconductor elements are bonded to the base plate by an electric insulation adhesive with the P-N junction disposed perpendicular to the base plate; and both opposite lateral walls of each light-emitting semiconductor element which are parallel with the P-N junction are fitted with a conductive light screen.

8 Claims, 11 Drawing Figures

LIGHT-EMITTING DISPLAY DEVICE

BACKGROUND OF THE INVENTION

1. Field of the Invention

This invention relates to a light-emitting display device, and more particularly to a light-emitting display device using light-emitting diodes.

2. Description of the Prior Art

The prior art light-emitting display device comprises a base plate bearing printed conductive layers and a plurality of light-emitting diodes so arranged on said base plate as to indicate a desired pattern, each of said light-emitting diodes being bonded to the base plate by an electric insulation adhesive with the P-N junction positioned perpendicular to the base plate. Both opposite lateral walls of the light-emitting diode are fitted with an ohmic electrode. However, the prior art light-emitting display device has the drawback that light emitted from the P-N junction of the light-emitting element permeates the ohmic electrode to leak sidewise and also is absorbed by said electrode, reducing the illuminating efficiency of the display device as a whole.

SUMMARY OF THE INVENTION

It is accordingly the object of this invention to provide a light-emitting display device improved in illuminating efficiency.

With a light-emitting display device according to this invention, a plurality of light-emitting semiconductor elements are so arranged as to represent a desired pattern on a base plate bearing printed conductive layers, each of said light-emitting semiconductor elements being bonded to the base plate with the P-N junction positioned substantially vertical to the base plate. Both opposite lateral walls of the light-emitting semiconductor element parallel with the P-N junction are fitted with a conductive light screen having a high reflective index. The light screen outwardly reflects light emitted from the P-N junction of the light-emitting semiconductor element, elevating the illuminating efficiency of said element.

BRIEF DESCRIPTION OF THE DRAWINGS

This invention can be more fully understood from the following detailed description when taken in conjunction with the accompanying drawings, in which.

DETAILED DESCRIPTION OF THE PREFERRED EMBODIMENTS

Figures 1, 2, 3, 4, 5, 6, 7:
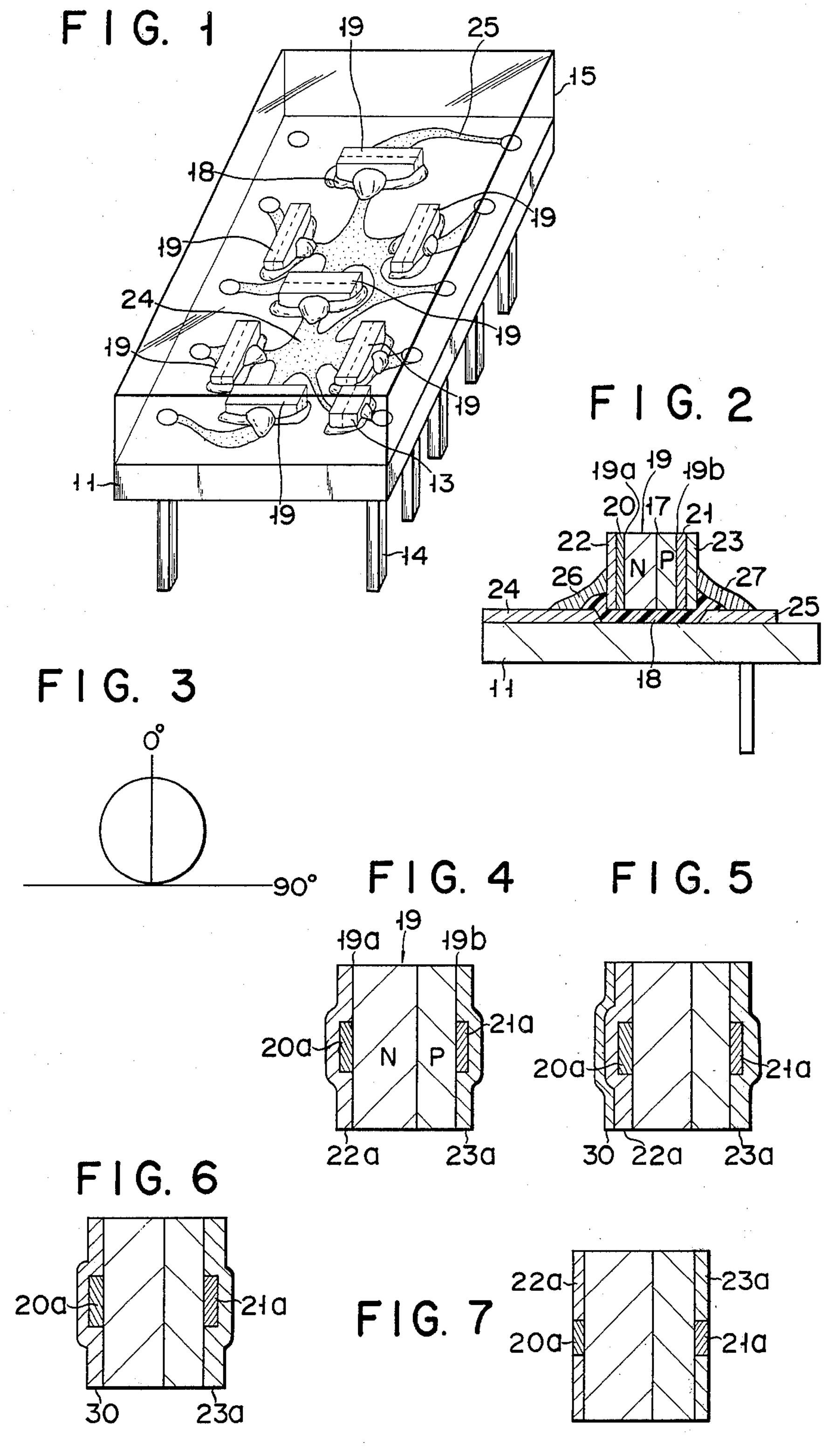
FIG. 1 is an oblique view of a light-emitting display device according to an embodiment of this invention.
FIG. 2 is a fractional cross sectional view of particularly the light-emitting element included in the display device of FIG. 1.
FIG. 3 schematically presents the distribution of light emitted from the light-emitting semiconductor element of the subject display device.
FIG. 4 is a cross sectional view of the light-emitting semiconductor element of the subject display device.
FIG. 5 is a cross sectional view of a light-emitting semiconductor element having one of the light screens coated with a metal layer bearing a different color from said screen.
FIGS. 6 to 8 show the cross sectional views of different types of light screens according to other embodiments of the invention.

FIG. 1 presents a light-emitting display device illuminating one character. This display device comprises a base plate 11 formed of electric insulation material such as ceramics, bakelite, epoxy resin, a mixture of glass and epoxy resin or polyimide resin; seven light-emitting semiconductor elements 19, for example, light-emitting diodes of gallium phosphide (GaP) arranged on the base plate 11 in the form of a digit "8" and one light-emitting semiconductor element 13 for indicating a decimal point; and a housing 15 for receiving all the above-mentioned components.

The light-emitting semiconductor element 19 is bonded to the base plate 11 by an electric insulation adhesive of, for example, transparent epoxy resin with the P-N junction 17 disposed perpendicular to the base plate 11. Both opposite lateral surfaces of the light-emitting semiconductor element 19 facing or parallel with the P-N junction 17, namely, an N type region surface 19*a* and a P type region surface 19*b* are fitted with ohmic electrodes 20, 21, which in turn are coated with conductive light screens 22, 23. These light screens 22, 23 are connected to printed conductive layers 24, 25 respectively formed on the base plate 11 by means of conductive membranes 26, 27 formed of paste of silver (Ag), or metal such as a lead (Pb) — tin (Sn) alloy, or a gold (Au) — tin (Sn) alloy and so disposed as to cover the exposed surface of the adhesive 18. The printed conductive layer 24 is connected in common to the N regions of the light-emitting semiconductor elements 19 and also to the corresponding external lead 14. In contrast, a plurality of printed conductive layers 25 are separately connected to the respective P regions of the light-emitting semiconductor elements, and also to the other corresponding external leads 14. The light screens 22, 23 mounted on opposite N type and P type region surfaces 19*a*, 19*b* of each light-emitting semiconductor element 19 parallel with the P-N junction thereof enable said element 19 to emit light with an ideal distribution illustrated in FIG. 3.

The foregoing embodiment refers to a light-emitting display device representing a single character. However, it is possible to provide a plurality of light-emitting display devices indicating several characters on the same base plate. Further according to said embodiment, the light-emitting semiconductor element 19 was fitted to the base plate 11 with the P-N junction positioned perpendicular to the base plate 11. However, said P-N junction may be slightly inclined to the base plate 11. If the housing 15 is formed of red transparent material where the light-emitting semiconductor element 19 consists of, for example, a red light-emitting type of gallium phoside diode, then the illuminating efficiency of the display device will be more elevated.

In another embodiment of FIG. 4, opposite N type and P type region surfaces 19*a*, 19*b* of the light-emitting semiconductor element 19 are partly fitted with ohmic electrodes 20*a*, 21*a* respectively. The light screens 22*a*, 23*a* are laid all over said surfaces 19*a*, 19*b* of the semiconductor element 19 including said ohmic electrodes 20*a*, 21*a*. The light screens 22*a*, 23*a* consist of highly reflective material such as gold (Au), silver (Ag), aluminum (Al), nickel (Ni) or platinum (Pt). The light screen enables light emitted from the light-emitting semiconductor element 19 to be effectively reflected to the outside, elevating the illuminating efficiency of said element 19 as externally observed. One light screen 22*a* mounted on the N region of the light-emitting element of gallium phosphide (GaP) is formed of a gold (Au) — silicon (Si) alloy about 1 micron thick containing 1 to 2% silicon (Si). In contrast, the other light screen 23*a* laid on the P region of said GaP semiconductor element consists of a gold (Au) — beryllium (Be) alloy about 1 micron thick containing 0.3 to 1% beryllium (Be). A light-emitting semiconductor element provided with a light screen thus prepared is fitted to the base plate 11 in the same manner as in the embodiment of FIG. 2.

According to the above-mentioned embodiment, both lateral surfaces of the light-emitting element 19 are fitted with light screens bearing the same shape and color, making it difficult to distinguish between the P and N regions of the light-emitting element 19 when a display device is assembled.

There will now be described other embodiments in which both opposite lateral surfaces of the light-emitting semiconductor element 19 parallel with the P-N junction are coated with light screens bearing different colors and/or shapes in order to avoid the above-mentioned inconvenience.

In the embodiment of FIG. 5, where the light screens 22*a*, 23*a* consist of different metal from those of FIG. 4, for example, white color metal such as aluminum, one light screen 22*a* is further covered with a gold membrane 30. This enables the P and N regions of the light-emitting semiconductor element 19 to be easily distinguished.

In the embodiment of FIG. 6, the light screen 22*a* used in the embodiment of FIG. 5 is omitted. Instead, the gold membrane 30 is directly fitted to one lateral wall of the light-emitting element 19 so as to concurrently act as a light screen.

According to the embodiment of FIG. 7, light screens 22*a*, 23*a* are mounted on both lateral surfaces of the light-emitting element 19 except for those portions on which the ohmic electrodes 20*a*, 21*a* are provided. These light screens 22*a*, 23*a* consist of metal membranes bearing different colors. Namely, one light screen 22*a* consists of a gold (Au) — zinc (Zn) alloy or a gold (Au) — beryllium (Be) alloy, whereas the other light screen 23*a* is formed of a gold (Au) — silicon (Si) alloy.

Figure 8:
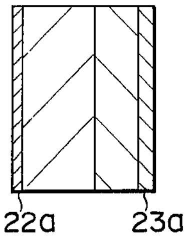

Still another embodiment of FIG. 8 omits ohmic electrodes 20*a*, 21*a*. Light screens 22*a*, 23*a* made of metal layers bearing different colors are directly fitted to both N type and P type region surfaces 19*a*, 19*b* of the light-emitting semiconductor element 19.

Figure 9A:
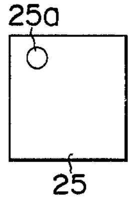
FIGS. 9 A and B are plan views of different types of light screen.
Figure 9B:
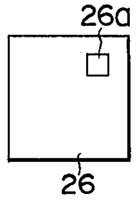

In a further embodiment of FIG. 9, both surfaces 19*a*, 19*b* of the light-emitting semiconductor element 19 are provided with light screens 25, 26 respectively bearing different shapes. These light screens 25, 26 are bored with holes 25*a*, 26*a*, one of which is, for example, round, and the other of which is, for example, square. That side of the light screens 25, 26 which faces the lateral surfaces of the light-emitting semiconductor element 19 is made flat, whereas the opposite side of said light screens 25, 26 is chosen to take an undulating surface, or to have the surface provided with recesses jointly constituting a lattice or matrix form.

Throughout the aforesaid embodiments, the light screen is prepared by evaporating or plating a layer of metal such as gold (Au), silver (Ag), aluminum (Al), nickel (Ni) or platinum (Pt).

Figure 10:
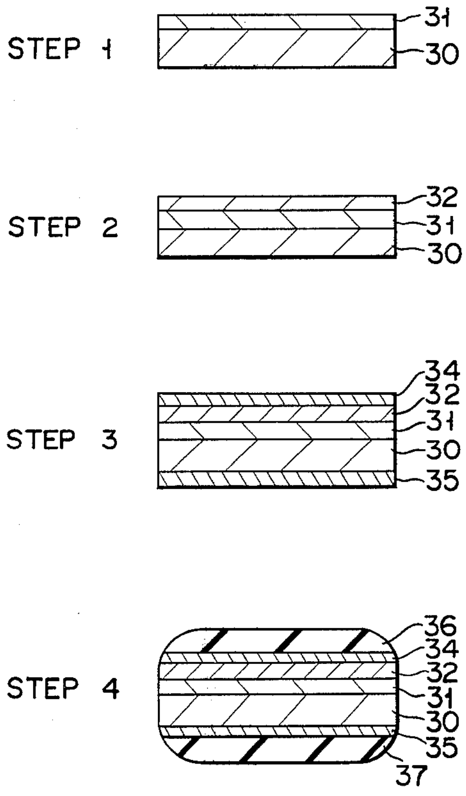
FIG. 10 indicates the sequential steps of preparing the light-emitting semiconductor element of the subject display device.

There will now be described the method of manufacturing the above-mentioned light-emitting display device. As illustrated in FIG. 10, the first step consists in producing a wafer 30 of N type gallium phosphide (GaP) single crystal about 250 microns thick bearing an orientation of (1.1.1.) and doping one side of the wafer 30 with tellarium (Te) by liquid phase growth to form an N type gallium phosphide layer 31 about 20 microns thick. In the second step, the N type gallium phosphide layer 31 is doped with oxygen and zinc (Zn) by liquid phase growth to form another N type gallium phosphide layer 32 about 20 microns thick. In the third step, light screens 34, 35 are evaporated or plated on the second N type gallium phosphide layer 32 and also on the opposite side of the N type GaP single crystal wafer 30 to that which is attached to the adjacent N type GaP layer 31 respectively. The light screen 34 is formed of a gold (Au) — silicon (Si) alloy containing 1 to 2 percent of silicon (Si) with a thickness of about 1 micron. In contrast, the light screen 35 is made of a gold (Au) — beryllium (Be) alloy containing 0.3 to 1 percent of beryllium. In this embodiment, both light screens 34, 35 are made concurrently to act as electrodes. Before deposition of the light screens 34, 35, however, ohmic electrodes may be mounted on the wafer 30 and the second N type gallium phosphide layer 32 respectively. In the fourth step, the exposed sides of the light screens 34, 35 are coated with, for example, solder layers 36, 37 to facilitate connection between said light screens 34, 35 and the corresponding external leads (not shown). The light-emitting wafer assembly constructed in the above-mentioned manner is cut up onto, for example, a plurality of light-emitting parallelepiped chips bearing a prescribed shape and size. These light-emitting chips are bonded to the base plate in the previously described pattern as segments of the subject display device. The base plate fitted with the light-emitting segmental elements is heated in a nonoxydizing atmosphere to melt the solder layers coated on the light-emitting segmental elements, thereby causing the light screens concurrently acting as electrodes to be connected to the external leads fitted to the base plate in advance.

What is claimed as new and desired to be secured by Letters Patent of the United States is:

1. A light-emitting display device comprising an electric insulation base plate bearing printed conductive layers; a plurality of light-emitting semiconductor elements bonded to prescribed parts of the base plate to present a desired pattern with the P-N junction of each light-emitting semiconductor element positioned substantially perpendicular to the base plate and each light-emitting semiconductor element having a pair of ohmic electrodes formed on opposite lateral surfaces thereof; a pair of conductive light reflective screens disposed adjacent to and in contact with the ohmic electrodes of each light-emitting semiconductor element; an electric insulation adhesive for bonding each light-emitting semiconductor element to a prescribed part of the base plate; and a conductive adhesive layer for each light-emitting semiconductor element disposed to cover the electric insulation adhesive layer to electrically connect the conductive layers printed on the base plate to the light reflective screens.

2. A light-emitting display device according to claim 1, wherein the conductive light screens are formed of metal membranes of different colors.

3. A light-emitting display device according to claim 1, wherein the conductive light screens are made of highly reflective metal membranes.

4. A light-emitting display device according to claim 1, wherein one of the conductive light screens is made of one metal selected from the group consisting of gold, silver, platinum, nickel and aluminum, and the other conductive light screen is formed of one metal selected from the above-mentioned group having a different color from the metal constituting the first mentioned light screen.

5. A light-emitting display device according to claim 1, wherein the ohmic electrodes are mounted on part of both opposite lateral surfaces of the light-emitting semiconductor element, and the light screens are laid all over the light-emitting semiconductor element so as to cover the ohmic electrodes.

6. A light-emitting display device according to claim 1, wherein the ohmic electrodes are disposed on opposite lateral surfaces of the light-emitting semiconductor element, and the light screens are disposed on said both opposite lateral surfaces of the light-emitting semiconductor element, except for those portions which are disposed on the ohmic electrodes.

7. A light-emitting display device according to claim 6, wherein the light screen disposed on the P region surface of the light-emitting semiconductor element consists of one alloy selected from the group consisting of a gold (Au) — zinc (Zn) alloy and a gold (Au) — beryllium (Be) alloy, and the light screen laid on the N region surface of the light-emitting semiconductor element is made of a gold (Au) — silicon (Si) alloy.

8. A light-emitting display device according to claim 1, wherein the conductive light screens are prepared from metal membranes bearing different shapes.

* * * * *